(12) United States Patent
Cowans

(10) Patent No.: US 7,442,275 B2
(45) Date of Patent: Oct. 28, 2008

(54) LATERAL TEMPERATURE EQUALIZING SYSTEM FOR LARGE AREA SURFACES DURING PROCESSING

(75) Inventor: Kenneth W. Cowans, Fullerton, CA (US)

(73) Assignee: Advanced Thermal Sciences, Anaheim, CA (US)

( * ) Notice: Subject to any disclaimer, the term of this patent is extended or adjusted under 35 U.S.C. 154(b) by 278 days.

(21) Appl. No.: 11/357,974

(22) Filed: Feb. 22, 2006

(65) Prior Publication Data

US 2006/0137822 A1    Jun. 29, 2006

Related U.S. Application Data

(62) Division of application No. 10/455,491, filed on Jun. 4, 2003, now Pat. No. 7,195,693.

(60) Provisional application No. 60/386,519, filed on Jun. 5, 2002.

(51) Int. Cl.
  *C23C 16/00* (2006.01)
  *C23F 1/00* (2006.01)
  *H01L 21/306* (2006.01)
(52) U.S. Cl. .................. 156/345.52; 118/715; 118/724; 118/725
(58) Field of Classification Search .................. 118/725; 156/345.52
  See application file for complete search history.

(56) References Cited

U.S. PATENT DOCUMENTS 4,853,100 A * 8/1989 Hsu ........................... 204/256
4,880,053 A * 11/1989 Sheyman ................ 165/104.26
5,556,500 A * 9/1996 Hasegawa et al. ....... 156/345.27
5,609,720 A * 3/1997 Lenz et al. ................... 438/715
5,769,154 A * 6/1998 Adkins et al. ........... 165/104.26
6,237,223 B1 * 5/2001 McCullough .......... 29/890.032
6,736,206 B2 * 5/2004 Hisai .......................... 165/260

FOREIGN PATENT DOCUMENTS

JP          59019328 A  *  1/1984

* cited by examiner

*Primary Examiner*—Parviz Hassanzadeh
*Assistant Examiner*—Rakesh K Dhingra
(74) *Attorney, Agent, or Firm*—Jones Tullar Cooper, PC; Raymond A. Bogucki

(57) ABSTRACT

In many processes used in fabricating semiconductors the wafer is seated on the top surface of a pedestal and heated in a high energy process step, such as plasma etching. The pedestal, chuck or platen may be cooling but the wafer gradually heats until the process can no longer continue. Where large, e.g. 300 mm diameter, wafers are being processed the temperature level across the wafer is difficult to maintain substantially constant. In this system and method the lateral temperature distribution is equalized by a heat sink structure in a chamber immediately under the wafer support on top of the pedestal. A number of spatially distributed wicking posts extend downwardly from a layer of wicking material across the top of the chamber, into a pool of a vaporizable liquid. At hot spots, vaporized liquid is generated and transported to adjacent condensation posts extending up from the liquid. The system thus passively extracts heat to equalize temperatures while recirculating liquid and assuring adequate supply. The free volume above and within the liquid, and the short distances between posts, assure adequate heat transfer rates.

6 Claims, 4 Drawing Sheets

LATERAL TEMPERATURE EQUALIZING SYSTEM FOR LARGE AREA SURFACES DURING PROCESSING

CROSS-REFERENCE TO RELATED APPLICATIONS

This U.S. patent application is a division of prior U.S. patent application 10/455,491, filed Jun. 4, 2003, now U.S. Pat. No. 7.195,693, issued Mar. 27, 2007. That application claimed priority to provisional patent application 60/386,5 19, filed Jun. 5, 2002, the disclosures of all of which are expressly incorporated herein by reference.

FIELD OF THE INVENTION

This invention relates to systems for supporting and laterally equalizing the temperature of surfaces during heating processing steps, and more particularly to systems for equalizing temperatures across the surface of large area semiconductor wafers.

The development of semiconductor processing technology has consistently tended, for economic and technical reasons, to use increasingly larger semiconductor wafers, in order to multiply the number of individual patterns that may be disposed on the surface of the wafer and thus processed concurrently. In the current state of the art equipment is now in use for processing wafers of 300 mm in diameter. Wafers of this size present problems not heretofore encountered, as to assuring uniformity of the individual patterns in the array wafer. Fabrication phases begin with pattern deposition sequences typical of those employed in photomicrolithography, after which semiconductor layers are formed by high energy processes, such as plasma etching or ionic bombardment. Different phases are carried out until all layers have been deposited. The wafer, enclosed within a chamber having the needed environment, such as a gas or vacuum, is supported on a pedestal or chuck configured to hold the wafer firmly while slowing temperature buildup at the wafer. The total amount of thermal energy to be removed from the wafer may be of the order of several kilowatts, so that it is to be expected, with a 300 mm wafer, that temperature across the surface of the wafer will not be uniform.

Modern semiconductor fabrication equipment employs many process steps in which semiconductor wafers advance progressively to different fabrication tools, usually by robotic handling systems. Positioning, retention and often temperature control of the wafers can be critical because of the very demanding precision involved and the need for high throughput with maximum yield. Wafer supports, often called chucks or platens, now hold the wafer firmly by such means as electrostatic attraction and also cool the wafer itself, as by circulating a heat conductive inert gas (e.g. helium or argon) between the opposed faces of the wafer and the pedestal on which it rests. For the latter purpose, a relief pattern in the pedestal (or platen) surface provides gas flow paths in contact with the wafer, and interior conduits in the pedestal facilitate circulation of the heat transfer gas into the limited interspace between the opposing surfaces. Examples of such systems are U.S. Pat. No. 6,320,736 to Shamoulian et al, U.S. Pat. No. 6,315,828 to Paladia et al, U.S. Pat. No. 6,310,755 to Kholodenko et al and U.S. Pat. No. 5,748,435 to Parkhe. The Shamoulian et al patent points out that certain geometrical factors can cause variations in heat transfer rates across the substrate, and that different parts of a substrate (wafer) surface can result in different heat loads at different parts of the surface. It proposes the use of different pressures of heat transfer gas across the broad side of the substrate to counteract zonal variations, these to be obtained by the use of non-sealing protrusions of selected shapes.

As wafer sizes increase, however, as with 300 mm diameter wafers now being produced, local and/or lateral temperature variations cannot readily be compensated by such techniques. The heat transfer gas flowing in the interface spaces is not readily capable of equalizing temperatures laterally as well as extracting thermal energy. The likelihood of lateral variations in temperature is increased markedly with larger wafers, because area increases as the square of the radius.

The semiconductor wafer processing context is particularly demanding in terms of technical requirements and economic benefits. Other applications for lateral temperature equalization exist, however, and the present disclosure may be of benefit in these situations as well.

Various types of heat transfer devices are known and used in particular refrigeration applications. Standing alone, these devices have potential for meeting specific individual needs, but they do not suggest a solution to the lateral equalization problem presented by large semiconductor wafers. The heat pipe, for example, is based upon the use of a permeable or wicking material which retains a somewhat mobile heat transfer fluid in thermal equilibrium with its surroundings. By equilibration of liquid and vapor phases, thermal energy is absorbed in accordance with the heat of vaporization, following which vapor that is generated can readily migrate to a separate cooling area, to condense and be transported back, by the wicking action, to the region at which heat is being absorbed.

Another device that uses boiling and condensing is a "reflux" type of cooling system, which employs gravitational flow to return the condensate to the needed location in the system. Although a number of reflux devices are known, such devices do not suggest solutions to the problem of equalizing the temperature of a large semiconductor wafer that is being cooled.

The driving force in the basic heat pipe is the tendency of a liquid to wick through finely divided surfaces such as meshes or felts. Heat pipes first found application in the zero gravity environment of outer space, since wicking action is independent of gravitational force.

The main problem with applying heat pipes in systems that need tight coupling of heat source to sink is their difficulty in transferring large amounts of heat over long distances. The pressure pulling a liquid along a wick is inversely proportional to the interstitial distance between fibers or wires in the wick. Unfortunately the pressure drop undergone by the liquid as it travels along the wick is inversely proportional to the same distance squared. The balance between surface tension pressure driving the liquid phase in the wicking process and the pressure drop in the liquid means that there is an optimum mesh fineness for any heat pipe boundary condition. It also means that there is a limit to the distance that a given area of wick can transport an amount of heat with a given temperature difference. The controlling equations that govern these relationships are set out in texts, as for example, Dunn, P. D., "Heat Pipes", Third Edition, Pergamon Press, 1982.

SUMMARY OF THE INVENTION

In accordance with the invention, for the semiconductor processing application a chuck upon which a large area semiconductor wafer rests includes a pedestal surface coextensive and in thermal contact with the underside of the wafer, an intervening lateral temperature equalizing structure, and an underlying base or cathode structure. The lateral temperature equalizing structure is within a relatively small vertical gap between the pedestal surface and the upper side of the base or cathode. The underside of the pedestal is in contact with a layer of wicking material from which short lengths of wicking columns depend. The depending columns are distributed a really in a closely spaced pattern throughout the underside of the wicking layer and substantially coextensive with the wafer. The temperature equalizing structure occupies a volume which confines a pool of selected heat transfer fluid, such as ammonia, alcohol or water, into which the lower ends of the wicking columns extend without contacting the floor. A number of condenser fins, or posts, extend upwardly through the liquid from the floor, which constitutes the upper surface of the base, but do not contact the upper wicking layer. The condenser posts are interdigitated among the depending wick elements. The condenser posts, which may themselves be wicking elements, are sites for collection of condensate from vapor generated by heat transfer. The interfacing thermal transfer gas under the wafer extracts some thermal energy out, and also convects some to the pedestal layer, which in turn transfers thermal energy within the lateral temperature equalization structure.

The underlying wicking layer and the spaced apart short wicking columns are spaced so that they are in close thermal coupling relation to all areas of the wafer. Higher temperature at any localized area of the wafer causes rapid stabilization of temperature in that area because of the proximity of sites at which vaporization occurs to one or more wicking posts and the interspersed condensation posts. All the posts have short path lengths to the pool of thermal transfer fluid. Gravitational forces are such that, given the shallow liquid pool, liquid will flow readily with exceedingly small changes in head. This action forces a high lateral heat flow if any temperature differences come into existence. Vapor movement occurs readily as well since there is little to impede flow of vapor in the lateral direction.

In a more particular example of a system in accordance with the invention, the wicking assembly on the top of the chamber is formed as a horizontal array of sintered metal plugs having intermeshed hexagonal caps or upper surfaces, and depending short wick posts or columns depending from the underside of the cap. At the lower half of the chamber, the condensation assembly is formed as an array of hexagonal conductive plugs with upstanding posts, interdigitated relative to the short wick elements as described above. A patterned sheet metal spring element fitted between the two assemblies has holes through which the upstanding conductive plugs can extend, and contains individual leaf springs formed therein which contact the underside of the depending wicking elements. The sheet metal spring plate thus both holds the conductive plugs in position under downward pressure, and urges the sintered metal plugs upwardly to maintain contact with the underside of the pedestal. In addition, the temperature equalization structure can be reinforced across its surface by strengthening posts which can support the pedestal against gas pressures and provide conduits for thermal transfer gases, wafer removal pins and the like which can function to aid removal of the wafer.

BRIEF DESCRIPTION OF THE DRAWINGS

A better understanding of the invention may be had by reference to the following description, taken together with the accompanying drawings, in which.

DETAILED DESCRIPTION OF THE INVENTION

Figure 1:
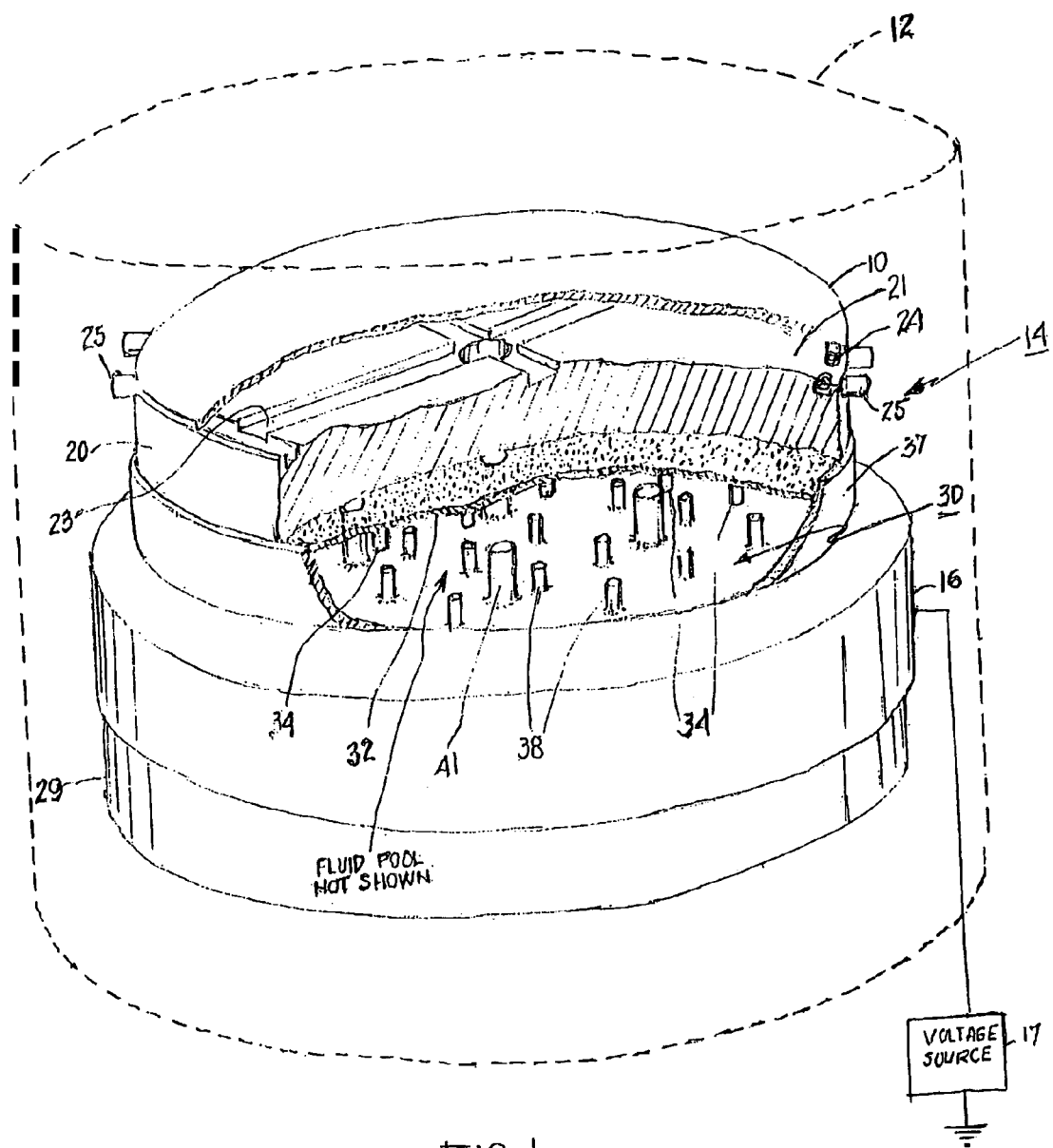
FIG. 1 is a simplified perspective view, partially broken away, of a wafer retention system including a lateral temperature equalization structure in accordance with the invention.

A system in accordance with the invention, referring now to FIG. 1, is compatible with and complementary to electrostatic chuck systems of the type generally described above. While the system may be employed with any size wafer (substrate), it is uniquely adapted to resolving the critical heat distribution problems encountered with the large 300 mm diameter wafers. The example of FIG. 1 depicts a 300 mm semiconductor wafer 10 in a process chamber 12, indicated only by dotted lines, in which a high energy etching step, such as plasma etching, is to be effected. No disclosure of a specific example or details are needed, as to the wafer holding structure, in view of the state of the art. The electrostatic chuck device 14 on which the wafer 10 is precisely mounted comprises a cathode base 16 that is charged in a desired polarity by a voltage source 17, and an uppermost pedestal (also sometimes called a chuck or platen) 20 with a surface 21 having patterned depressions, such as grooves 23, including apertures for circulating an inert heat transfer gas (helium or argon) through the small interspaces between the upper surface 21 of the pedestal 20 and the underside of the wafer 10. After the gas is fed in at a port 24, it flows through the available spaces until it is extracted at another port 25. More specific examples or descriptions are not included because they may be found in the patents referred to above and others.

The dynamics of a high energy process procedure such as plasma etching, as they affect the wafer 10 surface, vary with time and a real distribution as the procedure is carried out. For example, the wafer 10 and chuck 14 are initially refrigerated to the lowest value (e.g. −30° C.) in an acceptably non-damaging range, and the process procedure (e.g. plasma heating) increases the temperature with time until a maximum acceptable upper limit (e.g. 70° C.) is reached. The thermal energy transferred from the wafer 10 to the pedestal 20 through the circulating heat transfer gas provides one restraint on the rate of temperature increase as thermal energy is constantly extracted. Another restraint on temperature increase is a static or dynamic heat exchanger or sink 29 coupled to the cathode base 16, but together these cannot substantially extend the useful time span during which acceptable process temperatures exist at the wafer. Furthermore, the suggested modification of the local flows of the heat transfer gas is the only avenue by which temperature variations across the wafer 10 can be counteracted, and as noted these expedients cannot readily suffice for the much greater temperature disparities encountered with 300 mm (and larger) wafers.

Figure 2:
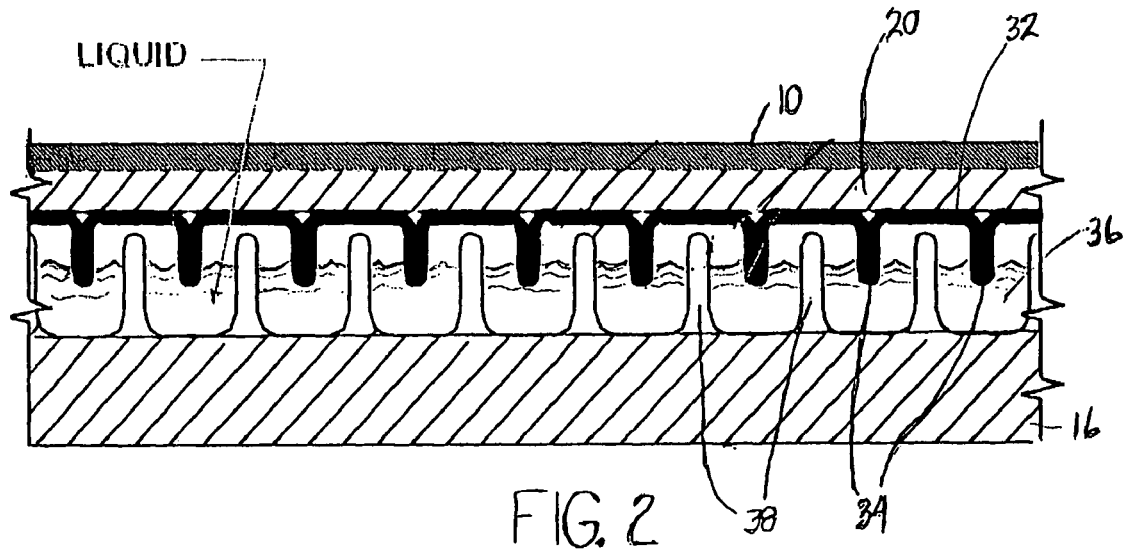
FIG. 2 is a simplified side sectional partial view of a lateral temperature equalization structure in accordance with the invention, showing further details thereof.
Figure 5:
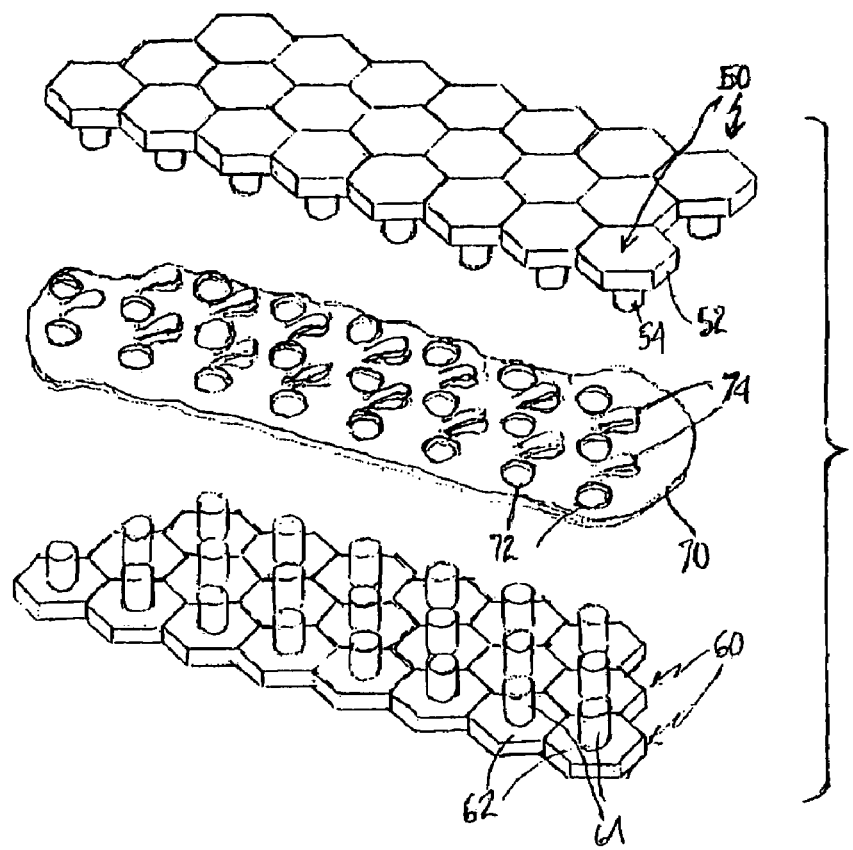
FIG. 5 is an exploded perspective view of a more specific example of heat transfer structure in an equalization unit in accordance with the invention.
Figure 6:
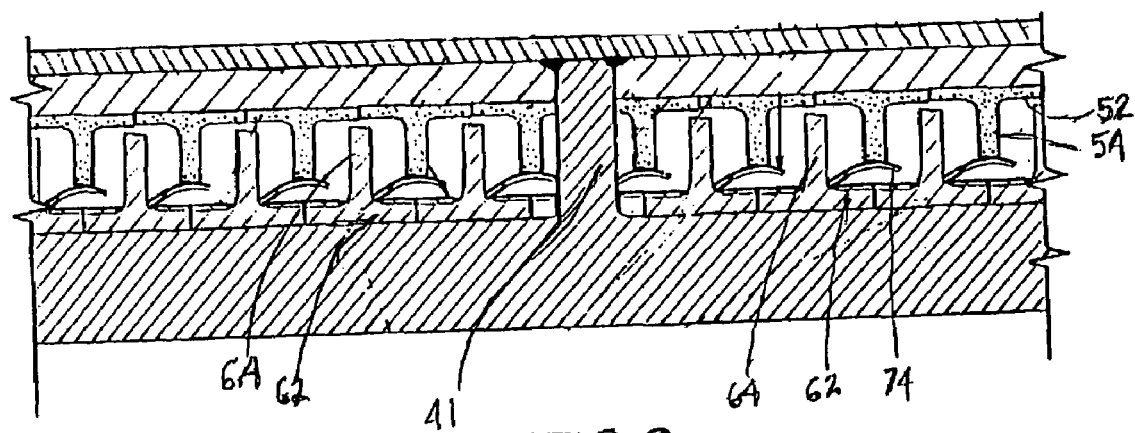
FIG. 6 is a side sectional partial view showing the assembly of the elements depicted in FIG. 5.
Figure 1:
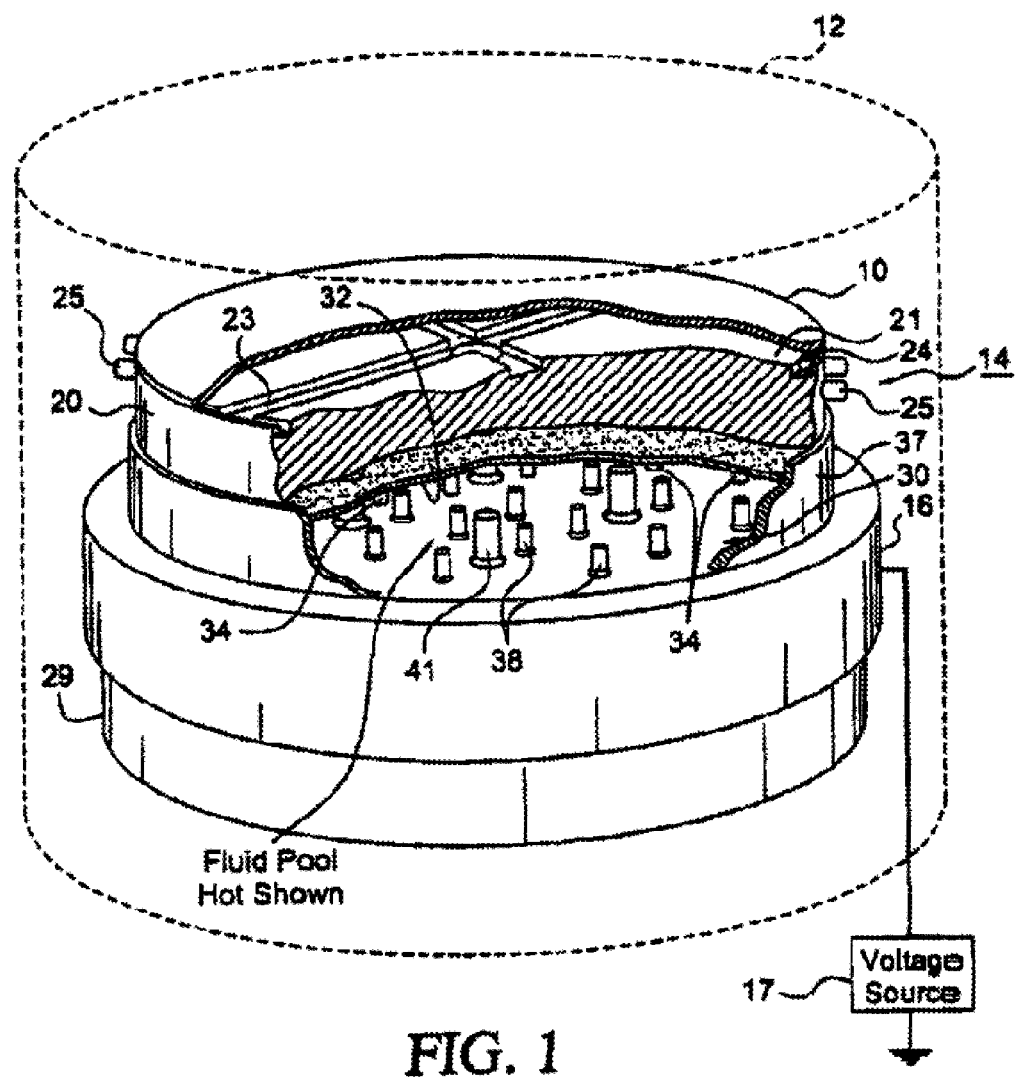
Figure 2:
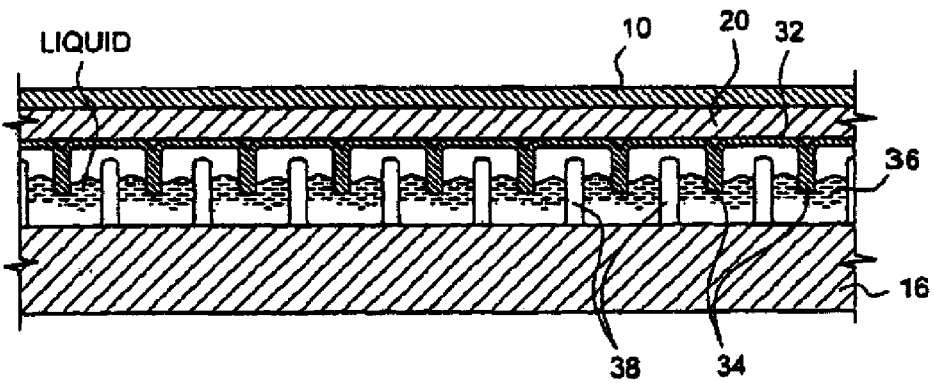
Figure 3:
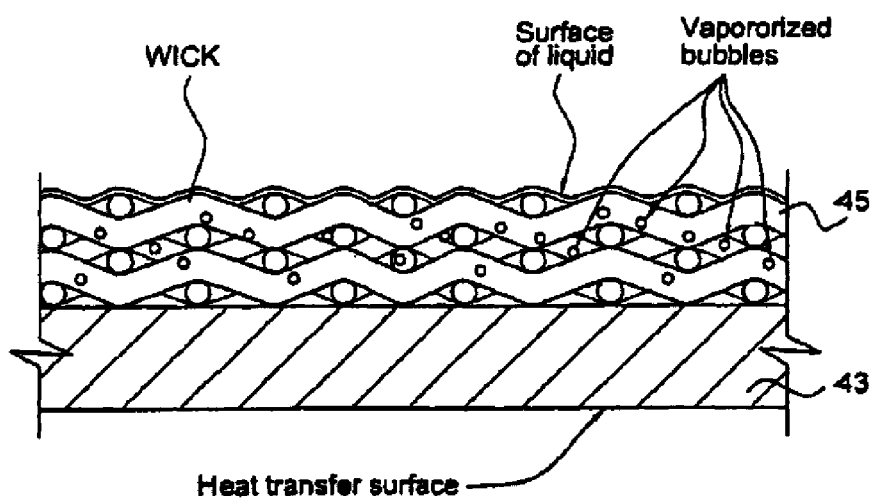
Figure 4:
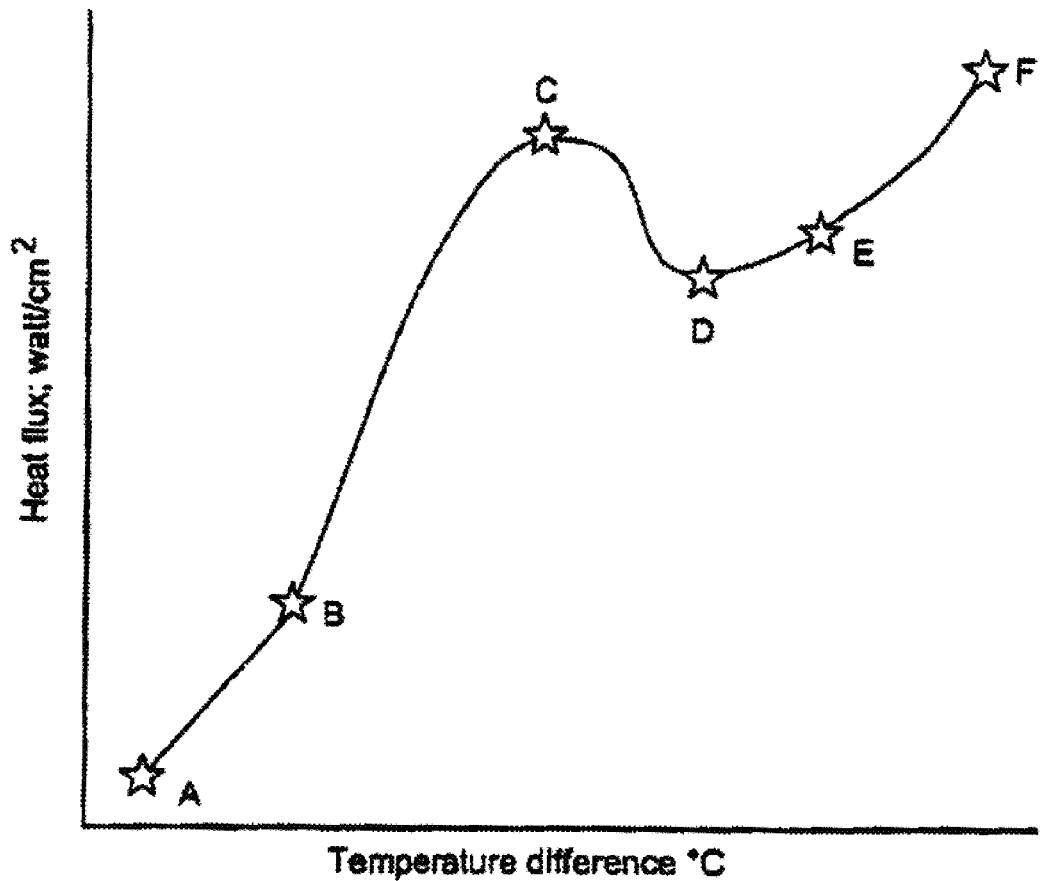
Figure 5:
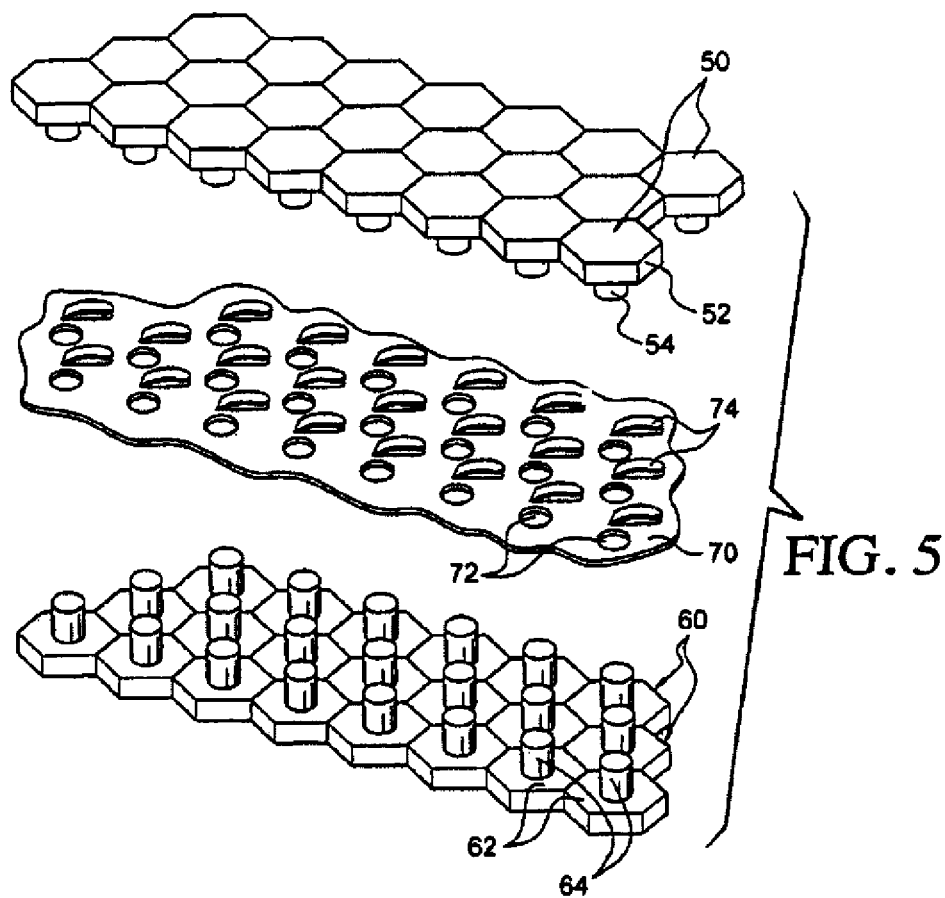
Figure 6:
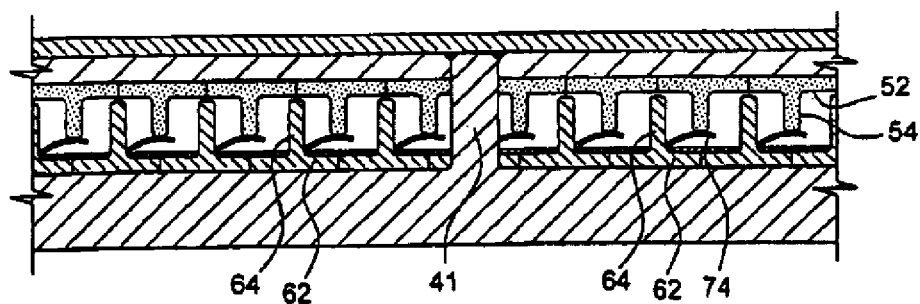

In accordance with the invention, the chuck 14 is configured to include a lateral heat distribution or equalization structure 30 immediately below the pedestal 20. The equalization structure comprises a chamber or volume with a roof and floor separated by a relatively low elevation. Reference is made here to FIG. 2 as well as FIG. 1. A layer of wicking material 32 is coextensive with the underside area (roof) of the top of the pedestal 20. The wicking material may be of sintered metal, woven or non-woven fabric, or other porous or permeable material capable of sustaining wicking action (i.e. migration of liquid against gravitational forces). An array of depending wicking posts 34 are spatially dispersed, here in a pattern of closely spaced geometry, throughout the area of the wicking material 32. Although the posts 34 are short, they cumulatively provide a high surface area for vaporization, and their lower ends are immersed in a pool of thermal transfer liquid 36 (shown only in FIG. 2) which is confined within a peripheral barrier 37 on the upper side of the base at cathode 16. The thermal transfer liquid 36 is advantageously from the class of liquids having relatively low evaporation points and viscosity, such as ammonia, alcohol or distilled water. A separate array of condenser fins or posts 38 extends upwardly from the liquid pool 36, in regularly interdigitated relation to the depending wicking posts 34. The fins 38 serve to provide a large net area of relatively cooler condensate collector for vapor in the interior volume. For clarity, the view of FIG. 1 shows a lower concentration of posts, and therefore a greater separation between them, than will usually be employed in practice. The relative displacements between the interdigitated elements that are shown in FIGS. 2, 5 and 6 are more indicative of the spatial relationships to be used in functioning units. The pedestal 20 is supported in this example against forces exerted during operation by a number of a really distributed and somewhat larger posts 41, here called "strength posts", although these or similar interspersed elements may alternatively be used for other purposes.

The lateral temperature equalization system 30 enables use of heat pipe technology in distributing heat uniformly over a short distance in combination with the ability of a reflux system to transfer heat rapidly with the aid of gravitational forces.

It achieves this by utilizing the equivalent of an assemblage of many heat pipes with a common reservoir of vapor-phase and liquid-phase thermal energy supply and sink sources. In FIG. 2 the fluid 36 layer is seen to be confined within the volume limited by the planar top wall of the cathode 16, the bottom wall of the top pedestal 20 surface, and the peripheral barrier 37. The thus enclosed heat exchange fluid 36, in thermal equilibrium with the surroundings, is composed of liquid and vapor phases in balance with each other. The wicking material of the top layer 32 and depending columns 34 is soaked with the liquid phase of the fluid and the vapor phase occupies the interior of the volume. Heat injected at any surface with which the wicking layer 32 is in thermal contact transfers that heat to the liquid in the wicking elements 32, vaporizing the fluid in the process of absorbing heat energy. The boiled off vapor flows to any cool area, such as the liquid pool 36 or condenser fins 38 where it condenses back to liquid. Heat will then be transferred to the heat exchanger or sink 29 outside the lateral equalization unit 30. The condensed liquid then wicks to the surface area where heat is being absorbed and the process continues in a closed cycle with no outside control or effort being needed.

This solution to the distance problem and the heat transfer difficulty enables the length of operative wick to be kept short but always in close thermal coupling. By so doing it is possible to pass enough fluid through the wick while keeping the cross sectional area of the wick small enough to allow adequate heat to pass through without encountering burnout. In accordance with the invention, as shown in FIGS. 1 and 2, the wick distance is kept short by employing a large number of separate wick assemblies. These are shown in FIG. 2 as a continuous length of wick 32 folded to form the depending posts 34 which dip, in short-distance intervals, into the pool 36 of liquid at the lower extremity of the internal volume. The storage of liquid in the pool allows ready transfer of the liquid from one side to the other to occur thereby augmenting the transverse thermal conductance of the system. The condensing surfaces consist of the plurality of standing posts or condenser fins 38 which are in thermal contact with the cathode or base 16 surface at their lower end and protrude for a short length above the surface of the liquid 36.

The balance between pressure drop and wicking force means that it is difficult to use heat pipe techniques to transfer heat over long distances. As the distance between heat source and sink increases, the wick area needed for a given power level increases rapidly. As the power to be transferred increases the wick area also needs to grow. Thus a wick assembly designed to absorb power over a large area should have a large cross section for flow. This large cross-sectional area causes trouble for systems that need tight coupling between heat transfer surfaces and the boiling or condensing fluid. These transfer processes are illustrated in somewhat idealized form in FIG. 3 for an interface between a heat transfer surface 43 and an overlying wick 45.

Figure 3:
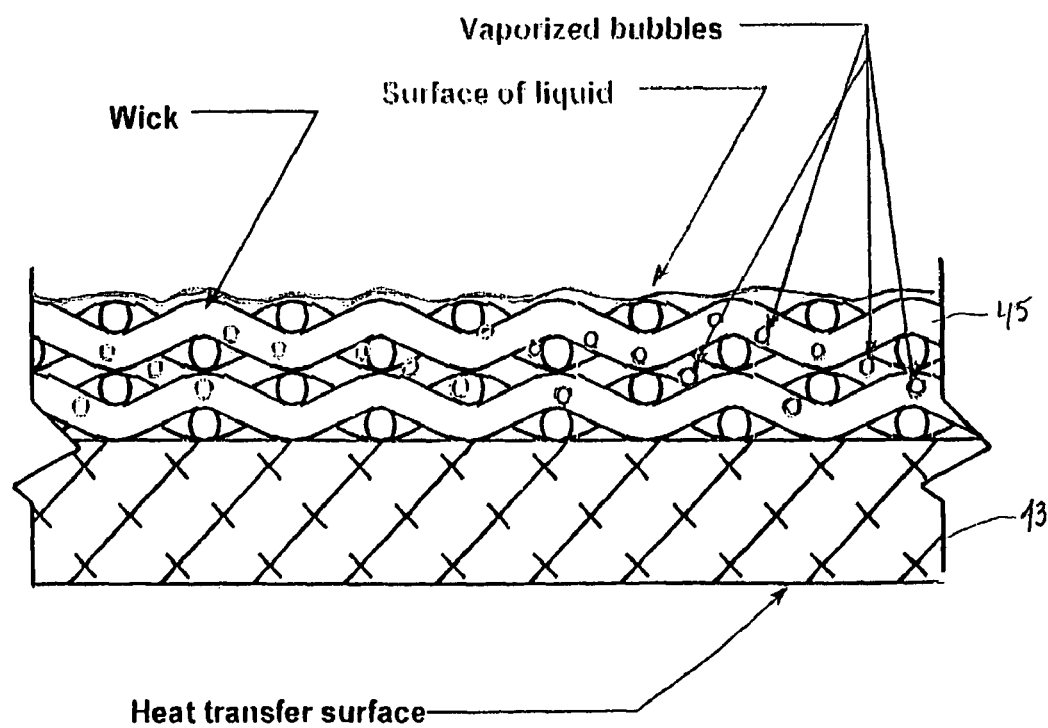
FIG. 3 is a simplified example of a wicking structure, useful in explaining the operation thereof.

In FIG. 3, the supportive boundary 43, ("Heat transfer surface") transfers heat to a "Wick" 45, filled by "liquid" whose upper surface is shown. If a relatively large amount of heat flux is transferred (ca. 1-10 $w/cm^2$ or more) the process results in bubbles ("Vaporized bubbles") being boiled off within the wick 45. This can cause problems with heat flux near the limit. The boiled vapor can completely fill the wick volume and prevent proper heat pipe action completely. When this occurs the heat transfer from the surface is almost completely stopped and a 'burnout' condition is reached.

Figure 4:
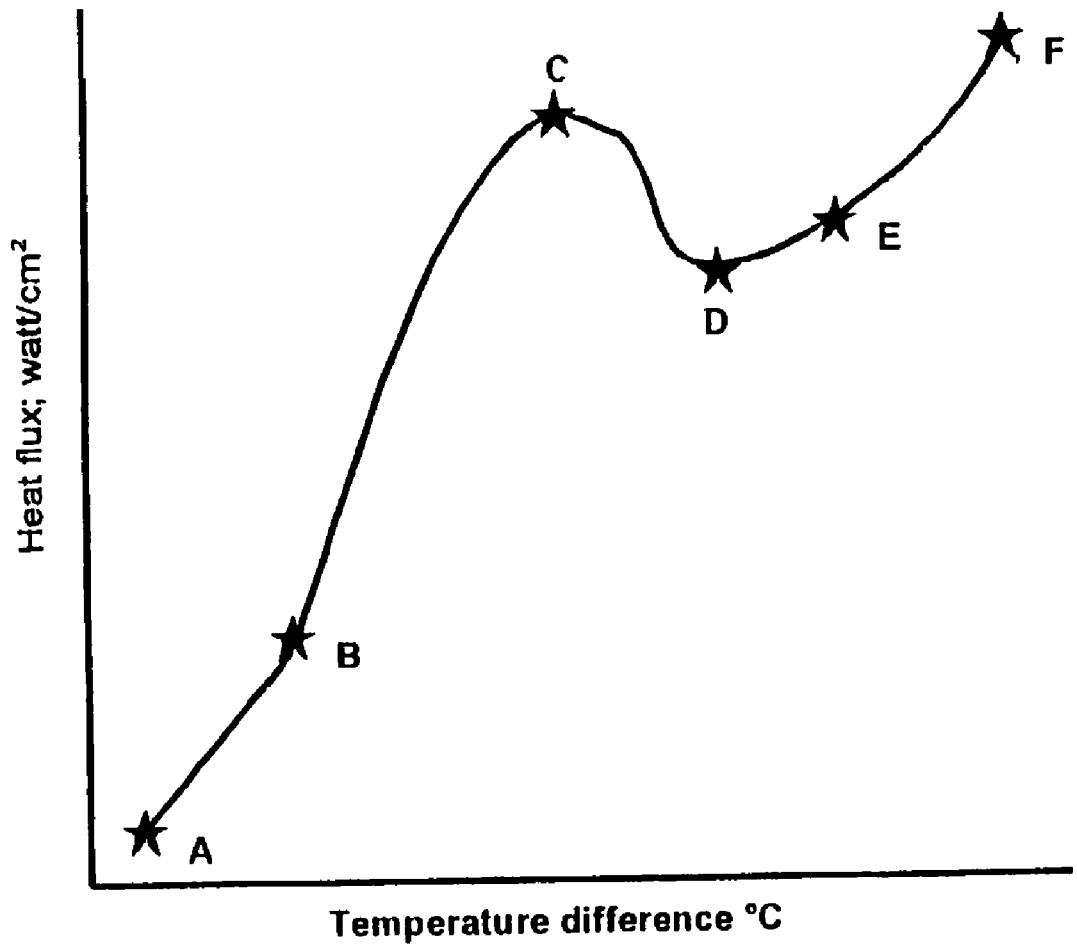
FIG. 4 is a graph of heat flux variations in relation to temperature difference, illustrative of the operation of a heat pipe and wicking structure.

'Burnout' is a phenomenon that is encountered in any type of heat transfer between a surface heat source and a boiling fluid. The general characteristics are shown in FIG. 4, wherein the various domains of boiling transfer are notated by letters 'A' through 'F'. From A to B heat will be transferred by natural convection. Evaporation of the fluid will only occur at the surface between liquid and vapor. In the range of B to C bubbles form at active nuclei on the heat transfer surface and rise through the pool of liquid to transfer heat via nucleate boiling. In this domain heat flux transferred varies as $\Delta T^n$ where n varies from 3 to 4. At point C the heat flux goes through a maximum, or peak heatflux, at a temperature called the "critical $\Delta T$". In the range from C to D where part of the heat transfer surface is insulated by a vapor film, heat flux decreases as $\Delta T$ increases. At point D heat flux passes through a minimum at the "Leidenfrost point". At this point and at higher temperature differences between heat transfer surface and liquid a film of vapor effectively insulates the liquid. In the film boiling regime from E to F heat is transferred through the vapor film by conduction and radiation. Point F, called the burnout point is the maximum temperature that can be reached by the particular apparatus employed for the measurement: typically the melting point of an electrical wire used as heat source.

There is a fundamental difference when a wick is introduced in the boiling interface. In the region B to C in FIG. 4 the heat transfer coefficients tend to be higher than they are in a planar surface interface; probably because of the higher tendency to form nuclei within the interstices of the wick. Point C however occurs at a lower heat flux level due to the blanking off of the wick when bubbles substantially fill the wick volume thereby preventing further flow of liquid to the heat transfer surface.

When a vapor condenses on a surface that is colder than the vapor's dew point the heat transfer is computed generally in the form of the equation:

$$h_m = K \Delta T^p / (L^n)$$

where: $h_m$=standard heat transfer coefficient

K is an empirical constant

L is the vertical length of a heat transfer surface $\Delta T$≡temperature difference between vapor and condensing heat sink surface n and p are empirical exponents; typically around ¼ to ⅓

The above equation evinces mathematically that it is useful to employ a number of short fins rather than a single long fin. The typical mechanism encountered in condensing heat transfer is film condensing wherein the vapor is insulated from the fin by a film of condensate that is flowing away from the heat transfer surface under the influence of gravity. Dropwise condensation, wherein the vapor condenses and flows away from the heat transfer in droplet form is somewhat more powerful than film condensation but it is harder to maintain this heat transfer mode in a stable manner.

In a practical example, referring now to FIGS. 5 and 6, the wicking body is fabricated in the form of small sintered metal plugs 50, each formed into a shape that is generally analogous to a thumbtack having a hexagonal head 52 and a post 54 extending from it. These plugs 50 are assembled with interengaging heads 52 to form a wicking layer as shown in FIG. 5 with a regularly spaced array of depending posts. The condensing fins ("conductive plugs") 60 are fabricated, in similar shapes with hexagonal heads 62 and perpendicular posts 64, and can be of a material with a high thermal conductivity such as copper or aluminum. Alternatively the conductive plugs 60 can be fabricated of sintered copper if the combination of wicking and condensing is more efficient at condensing the particular liquid used. The plugs 60 are also assembled with interlocking heads 62 to form a planar body, and disposed in opposition to the metal plugs 50 so that the wicking posts 54 and condensing posts 64 are interdigitated but not in contact. A sheet metal spring 70 is placed between these two assemblages and serves to keep all of the separate elements tightly forced in opposite directions against their respective heat transfer surfaces. An array of circular holes 72 in the sheet metal spring 70 are spaced to receive the individual upstanding posts 64, while adjacent finger springs 74 contact the depending sintered metal plug posts 54 to maintain the oppositely directed forces on the components of the assembly.

FIG. 6 also shows one of the strength posts 41 that reinforces the upper and lower walls surrounding the assembly. These horizontal walls also vertically confine the liquid and vapor that fills the interior volume of the temperature equalization unit. At higher temperatures the vapor pressure of the liquid used can reach fairly high pressures-ca. 60-70 atmospheres. The strength posts 41 are able to support the forces generated by such pressures. Some of the conductive plugs and also some of the sintered metal plugs may be specially shaped to accommodate as many strength posts placed at intervals as needed.

The strength posts 41, or similar interspersed elements, can incorporate conduits for any facilities needed by an electrostatic cathode such as gases used to transfer heat from wafer to chuck or lifting pins to separate wafer and chuck after processing. These details are best defined by those familiar with a particular chuck design.

For an estimate of the effectiveness of the concept, assume a system of cooling a load of 2 kw evenly distributed across a pedestal surface about 300 mm in diameter. This gives a heat flux of about 2.4 w/cm². It will be assumed that this load is cooled by a flow of heat exchanger liquid that heats up 10° C. as the liquid moves from one side of the chuck to the other. The temperature of the pedestal will be examined under these conditions. The wafer will be assumed to transfer heat into the pedestal across a free molecular barrier of helium gas at a pressure of 25 torr. The liquid flowing across the chuck is assumed to be "Galden HT 110" flowing in a heat transfer passage of about 0.5 cm×0.5 cm in extent.

Overall assumed parameters are:

AP#1. Fluid flow=2 gpm (gives approx 10° C. rise in temperature).

AP#2. Temperature of flow input=−10° C.

AP#3. Length of heat transfer passage=100 cm.

AP#4. Effective thickness of chuck=3 cm aluminum.

AP#5. Heat pipe material used is ammonia.

Calculated parameters are:

Heat transfer coefficient from chuck to wick=0.5 w/cm²°K ([1]extrapolated from water @ 2 atm.)

[1]McAdams, William H., *Heat Transmission*, 3rd edition, McGraw-Hill Book Co., Inc., New York, 1954, p. 382.

Heat transfer coefficient from Galden to surface of heat exchanger (based on heat exchanger surface area)=1.7 w/cm²° K.[2] AP32.

Heat transfer coefficient from Galden to surface of heat exchanger (based on pedestal; 300 mm dia. surface area)=0.48 w/cm²°K.

Temperature differences associated, at full load of 2 KW are:

CPT#1. $\Delta T = 13.9°$

CPT#2. $\Delta T = 5°$

CPT#3. $\Delta T = 2.5°$

CPT#4. $\Delta T = 4.2°$

For purposes of this calculation it will be assumed that all heat flows occur in steady-state and continue indefinitely. In actual fact the wafer/chuck assembly undergoes a transient cool-down/heat-up cycle with each wafer processing. The analysis given will, however, indicate the degree of improvement that can be expected with use of the lateral interface equalization unit.

To compare the wafer chuck system with and without the equalization some simplifying assumptions will be made:

1. Heat flux to the wafer is constant across the pedestal.
2. The chuck is transferring heat only to the cooling fluid
3. Heat is absorbed by the cooling fluid as if the fluid traveled across a diameter of the pedestal.
4. Heat transfer in the chuck body will be considered as one-dimensional: No consideration will be given to complex two and three dimensional models.

Using these assumptions and making some abbreviated calculations about the conditions that would occur in a chuck without the lateral temperature interface it is found that the temperature difference that exists across the pedestal is essentially the full 10° C. that the cooling fluid undergoes as the fluid traverses the pedestal and absorbs the 2 kw that impinges on the wafer surface. The heat conducted along the chuck in the aluminum body of the chuck is only around 3% of the total 2 kw so that it has little influence on the temperature difference within the cooling fluid's heat exchanger. Thus the chuck surface under the wafer will show the entire 10° C. temperature difference from the point at which the fluid enters the chuck heat exchanger to the point where the fluid leaves. The heat impinging on the wafer will not vary due to this temperature difference but the temperature of the wafer itself certainly will. As the wafer heats in the course of processing the wafer temperature at any point will reflect the temperature of the pedestal adjacent to the wafer at that point plus the temperature difference between wafer and chuck-calculated to be about 13.9° C. per CPT#1 above.

The introduction of the lateral temperature equalizing unit into the thermal system introduces a temperature difference comprised of the difference from the chuck surface under the wafer to ammonia boiling in the wick (CPT#2, ΔT=5°) plus that of the ammonia condensing on the plugs (CPT#3, ΔT=2.5°). This is a total of 7.5° C.; thus the addition of the equalization unit into the system increases the overall ΔT between wafer and cooling fluid. That additional temperature difference introduced is not the full 7.5° calculated. The effect of the interface equalization unit is that of a bar, the thermal conductivity of which is close to infinity in the direction parallel to the interface between wafer and chuck, and finite in the orthogonal direction. The temperature difference introduced by the equalization unit of the above model will be a total of not much more that 2.5° C. This is because the unit integrates the effect of the 10° C. temperature difference in the chuck caused by heating of the cooling fluid. The final temperature difference between any points on the upper surface of the chuck with lateral temperature equalization unit will be of the order of 0.25° C. or less if the heat flux impinging on the wafer surface is constant and the pressure between wafer and chuck is kept constant.

Although the concepts which provide apparatus and methods in accordance with the invention are particularly advantageous for the difficult problems involved in lateral stabilization of wafer temperatures, they are also useful in other applications. Manufacturing processes which use heated forms or molds to make critical surfaces, for example, may require temperature uniformity across a mold surface area, which can be facilitated when mold designs permit use of gravity for collection of an appropriate fluid. Heated molding processes are increasingly being used for forming complex optical surfaces, such as diffractive elements and aspheric lenses, and in such processes uniform surface temperatures across an area can be critically important. In a number of technologies, temperature stabilization of different elements in a physical array is a requisite for meeting critical operating requirements. In optical systems using wavelength division multiplexing, for example, signals are multiplexed and demultiplexed by glass or birefringent crystal elements mounted on a temperature controlled base, and a temperature equalization system can be of benefit in design as well as operating performance.

Although a number of forms and variations have been described, the invention is not limited thereto but includes all alternatives and modifications within the scope of the appended claims.

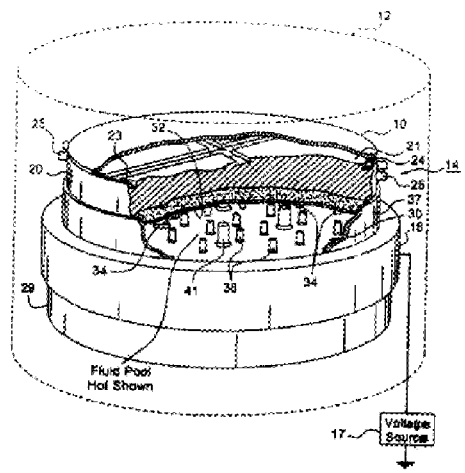

The invention claimed is:

1. A wafer supporting pedestal for maintaining the temperature across a semiconductor wafer substantially uniform as the wafer is heated on its upper side and the pedestal is cooled beneath the wafer, comprising:
   a pedestal body having a top surface and a pedestal compartment adjacent the underside of the top surface, the top surface supporting the wafer thereon, the compartment defining a shallow open volume below the top surface and including a sink having vaporizable liquid in the open volume;
   a surface of wicking material disposed on the underside of the top surface of the compartment, and including a plurality of distributed first wicking elements extending into vaporizable liquid, but not contacting the bottom of the compartment;
   a condensing surface comprising a second plurality of wicking elements protruding up from the bottom of the volume compartment to above the liquid level, but without contacting the top surface of the compartment, and the lateral distances between the downwardly extending and the upwardly protruding wicking elements each being respectively selected with respect to the transport distance and pressure of the liquid undergoing wicking action to minimize wicking transport distances.

2. An apparatus as set forth in claim 1 above, wherein the pedestal is configured to receive a semiconductor wafer of approximately 300 mm in diameter on the top surface, and wherein the liquid is a vaporizable liquid from the class including ammonia, $H_2O$ and alcohol.

3. An apparatus as set forth in claim 1 above, wherein the pedestal includes a gas cooling system interjecting gas between the top surface of the pedestal and the adjacent under surface of the wafer, and wherein the pedestal includes a cooling system in operative relation to the pedestal body below the compartment.

4. An apparatus as set forth in claim 3 above, wherein the upper surface of the compartment is covered with a wicking material and a plurality of depending wicking posts extending from the upper surface of the compartment into the liquid, and wherein the protruding elements also comprise condensing posts of wicking material interdigitized among the wicking posts.

5. An apparatus as set forth in claim 4 above, wherein the apparatus includes strength posts extending from the bottom of the housing to the top surface of the pedestal for withstanding interior pressures.

6. A structure providing a lateral heat distribution function for maintaining the temperature of a semiconductor wafer substantially uniform in the lateral direction during a heating process, comprising:
   a chamber having a roof and a floor for providing a substantially compact temperature equalizer for contact with a wafer supporting surface disposed on top of the roof that is in heat conductive engagement across the area of a semiconductor wafer;
   a plurality of first modular elements having heads with hexagonal outlines nested together to form a wall covering the upper side inside of the roof of the chamber, each hexagonal element having a depending post, and the hexagonal elements and posts each being of a wicking material;
   a plurality of second elements, each having a hexagonal head and of like configuration so that they fit together to form a planar base structure covering the floor of the chamber, each of the plurality of second hexagonal elements including an upstanding condensing post, the elements and posts being of wicking material, and nested together to provide a wall covering the floor of the chamber;
   a locking element having a substantially planar body for sandwiching between the plurality of the first and the second elements, which nest together into an interdigitated structure, the locking element having a plurality of openings for receiving the upstanding condensing posts of the lower structure and a plurality of spring elements for engaging the tips of the depending posts to urge the plurality of first modular elements into engagement with the upper surface of the chamber, the spring elements each holding a different one of the upper hexagonal heads out of contact with the adjacent condensing posts and the hexagonal heads of the second elements, and
   a vaporizable liquid in the chamber to a level wetting both the depending posts and the upstanding posts.

* * * * *

UNITED STATES PATENT AND TRADEMARK OFFICE
CERTIFICATE OF CORRECTION

PATENT NO.        : 7,442,275 B2
APPLICATION NO.   : 11/357974
DATED             : October 28, 2008
INVENTOR(S)       : Kenneth W. Cowans It is certified that error appears in the above-identified patent and that said Letters Patent is hereby corrected as shown below:

Title page should be deleted and substitute therefor the attached title page.

Drawings:
   Delete Figs. 1-6 and substitute therefor Figs. 1-6 as shown on the attached pages.

Signed and Sealed this

Nineteenth Day of May, 2009

JOHN DOLL
*Acting Director of the United States Patent and Trademark Office*

United States Patent
Cowans

(10) Patent No.: US 7,442,275 B2
(45) Date of Patent: Oct. 28, 2008

(54) LATERAL TEMPERATURE EQUALIZING SYSTEM FOR LARGE AREA SURFACES DURING PROCESSING

(75) Inventor: Kenneth W. Cowans, Fullerton, CA (US)

(73) Assignee: Advanced Thermal Sciences, Anaheim, CA (US)

(*) Notice: Subject to any disclaimer, the term of this patent is extended or adjusted under 35 U.S.C. 154(b) by 278 days.

(21) Appl. No.: 11/357,974

(22) Filed: Feb. 22, 2006

(65) Prior Publication Data
US 2006/0137822 A1    Jun. 29, 2006

Related U.S. Application Data

(62) Division of application No. 10/455,491, filed on Jun. 4, 2003, now Pat. No. 7,195,693.

(60) Provisional application No. 60/386,519, filed on Jun. 5, 2002.

(51) Int. Cl.
  *C23C 16/00* (2006.01)
  *C23F 1/00* (2006.01)
  *H01L 21/306* (2006.01)

(52) U.S. Cl. .......... 156/345.52; 118/715; 118/724; 118/725

(58) Field of Classification Search ............ 118/725; 156/345.52
See application file for complete search history.

(56) References Cited

U.S. PATENT DOCUMENTS

| | | | | | |
|---|---|---|---|---|---|
| 4,853,100 | A | * | 8/1989 | Hsu | 204/256 |
| 4,880,053 | A | * | 11/1989 | Sheyman | 165/104.26 |
| 5,556,500 | A | * | 9/1996 | Hasegawa et al. | 156/345.27 |
| 5,609,720 | A | * | 3/1997 | Lenz et al. | 438/715 |
| 5,769,154 | A | * | 6/1998 | Adkins et al. | 165/104.26 |
| 6,237,223 | B1 | * | 5/2001 | McCullough | 29/890.032 |
| 6,736,206 | B2 | * | 5/2004 | Hisai | 165/260 |

FOREIGN PATENT DOCUMENTS

JP    59019328 A    *  1/1984

* cited by examiner

*Primary Examiner*—Parviz Hassanzadeh
*Assistant Examiner*—Rakesh K Dhingra
(74) *Attorney, Agent, or Firm*—Jones Tullar Cooper, PC; Raymond A. Bogucki

(57) ABSTRACT

In many processes used in fabricating semiconductors the wafer is seated on the top surface of a pedestal and heated in a high energy process step, such as plasma etching. The pedestal, chuck or platen may be cooling but the wafer gradually heats until the process can no longer continue. Where large, e.g. 300 mm diameter, wafers are being processed the temperature level across the wafer is difficult to maintain substantially constant. In this system and method the lateral temperature distribution is equalized by a heat sink structure in a chamber immediately under the wafer support on top of the pedestal. A number of spatially distributed wicking posts extend downwardly from a layer of wicking material across the top of the chamber, into a pool of a vaporizable liquid. At hot spots, vaporized liquid is generated and transported to adjacent condensation posts extending up from the liquid. The system thus passively extracts heat to equalize temperatures while recirculating liquid and assuring adequate supply. The free volume above and within the liquid, and the short distances between posts, assure adequate heat transfer rates.

6 Claims, 4 Drawing Sheets